US012813300B2

(12) United States Patent
Baek et al.

(10) Patent No.: US 12,813,300 B2
(45) Date of Patent: Nov. 24, 2026

(54) SEMICONDUCTOR PACKAGE INCLUDING A REDISTRIBUTION STRUCTURE

(71) Applicant: SAMSUNG ELECTRONICS CO., LTD., Suwon-si (KR)

(72) Inventors: Sangjin Baek, Suwon-si (KR); Kyungdon Mun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 478 days.

(21) Appl. No.: 18/500,098

(22) Filed: Nov. 1, 2023

(65) Prior Publication Data

US 2024/0332157 A1 Oct. 3, 2024

(30) Foreign Application Priority Data

Mar. 28, 2023 (KR) ........................ 10-2023-0040723

(51) Int. Cl.

| | |
|---|---|
| ***H10W 70/65*** | (2026.01) |
| ***H10W 70/685*** | (2026.01) |
| ***H10W 72/00*** | (2026.01) |
| ***H10W 72/20*** | (2026.01) |
| ***H10W 72/29*** | (2026.01) |

(Continued)

(52) U.S. Cl.

CPC ......... *H10W 70/65* (2026.01); *H10W 70/685* (2026.01); *H10W 72/90* (2026.01); *H10W 74/117* (2026.01); *H10W 72/072* (2026.01); *H10W 72/242* (2026.01); *H10W 72/252* (2026.01); *H10W 72/29* (2026.01); *H10W 90/724* (2026.01)

(58) Field of Classification Search

CPC ... H10W 70/65; H10W 70/685; H10W 72/90; H10W 74/117; H10W 72/072; H10W 72/242; H10W 72/252; H10W 72/29; H10W 90/724; H10W 70/614; H10W 90/701; H10W 72/20; H10W 20/40; H10W 70/66; H10W 42/00; H10W 70/60; H10W 70/652; H10W 70/654; H10W 72/07252; H10W 72/07253; H10W 72/221; H10W 72/234; H10P 72/74; H10P 72/7424

See application file for complete search history.

(56) References Cited

U.S. PATENT DOCUMENTS

| | | | |
|---|---|---|---|
| 8,847,388 | B2 | 9/2014 | Yu et al. |
| 9,345,148 | B2 | 5/2016 | Pendse |

(Continued)

*Primary Examiner* — Mohammad A Rahman

(74) *Attorney, Agent, or Firm* — Morgan, Lewis & Bockius LLP

(57) ABSTRACT

A semiconductor package includes a redistribution structure including an insulating layer. A plurality of redistribution layers are disposed within the insulating layer. A recess extends from an upper surface of the insulating layer and exposes at least a portion of a first uppermost redistribution layer. A first pad structure is disposed on a bottom and an inner wall of the recess. The first pad structure defines a cavity that is open upwardly. A semiconductor chip is disposed on the upper surface of the redistribution structure and includes a connection terminal electrically connected to the plurality of redistribution layers. A connection bump is disposed within the cavity and electrically connects the connection terminal of the semiconductor chip to the first pad structure of the redistribution structure. An encapsulant covers at least a portion of the semiconductor chip.

20 Claims, 20 Drawing Sheets

(51) Int. Cl.

| | |
|---|---|
| ***H10W 72/90*** | (2026.01) |
| ***H10W 74/10*** | (2026.01) |
| ***H10W 90/00*** | (2026.01) |

(56) References Cited

U.S. PATENT DOCUMENTS

| | | | | |
|---|---|---|---|---|
| 9,520,381 | B2 | 12/2016 | Higuchi | |
| 10,867,944 | B2 | 12/2020 | Wu | |
| 2011/0101520 | A1 | 5/2011 | Liu et al. | |
| 2014/0291839 | A1 | 10/2014 | Pendse et al. | |
| 2015/0097287 | A1 | 4/2015 | Chen et al. | |
| 2017/0236802 | A1 | 8/2017 | Hsieh et al. | |
| 2019/0131228 | A1* | 5/2019 | Chun | H10W 20/023 |
| 2020/0251436 | A1 | 8/2020 | Williamson et al. | |
| 2023/0307251 | A1* | 9/2023 | Liu | H10W 70/09 |
| 2024/0047552 | A1* | 2/2024 | Kuo | H10D 1/047 |

* cited by examiner

SEMICONDUCTOR PACKAGE INCLUDING A REDISTRIBUTION STRUCTURE

CROSS-REFERENCE TO RELATED APPLICATION(S)

This application claims priority under 35 U.S.C. § 119 to Korean Patent Application No. 10-2023-0040723, filed on Mar. 28, 2023, in the Korean Intellectual Property Office, the disclosure of which is herein incorporated by reference in its entirety.

TECHNICAL FIELD

The present disclosure relates to a semiconductor package and, more specifically, to a semiconductor package including a redistribution structure.

DISCUSSION OF THE RELATED ART

In accordance with a desire to achieve a lightweight structure and high performance, miniaturized and high performance semiconductor chips and thinned semiconductor packages are being developed. In order to secure heat dissipation characteristics of the high performance semiconductor chip, a thickness of the semiconductor chip is increased, while a distance between the semiconductor chip and a package substrate is reduced, which may cause a decrease in connection reliability between the semiconductor chip and the package substrate.

SUMMARY

A semiconductor package includes a redistribution structure including an insulating layer defining an upper surface of the redistribution structure and a lower surface of the redistribution structure. A plurality of redistribution layers are disposed within the insulating layer. A recess extends from the upper surface into the insulating layer and exposes at least a portion of a first uppermost redistribution layer among the plurality of redistribution layers. A first pad structure is disposed on a bottom of the recess and an inner wall of the recess, and defines a cavity that is open upwardly. A semiconductor chip is disposed on the upper surface of the redistribution structure, and includes a connection terminal electrically connected to the plurality of redistribution layers. A connection bump is disposed within the cavity, and electrically connects the connection terminal of the semiconductor chip and the first pad structure of the redistribution structure to each other. An encapsulant covers at least a portion of the semiconductor chip.

A semiconductor package includes a redistribution structure including an insulating layer defining an upper surface of the redistribution structure and a lower surface of the redistribution structure. A plurality of redistribution layers are disposed within the insulating layer. A pad structure extends into the insulating layer from the upper surface, is connected to at least a portion of an uppermost redistribution layer among the plurality of redistribution layers, and defines a cavity that is open upwardly. A semiconductor chip is disposed on the redistribution structure, and includes a connection terminal electrically connected to the plurality of redistribution layers. A connection bump is disposed on the pad structure, and electrically connects the connection terminal of the semiconductor chip and the pad structure to each other. A lower surface of the connection bump is lower than the upper surface of the uppermost redistribution layer.

A semiconductor package includes a redistribution structure including an insulating layer defining an upper surface of the redistribution structure and a lower surface of the redistribution structure. A plurality of redistribution layers are disposed within the insulating layer. A pad structure extends into the insulating layer from the upper surface, is connected to at least a portion of an uppermost redistribution layer among the plurality of redistribution layers, and defines a cavity that opens upwardly. A semiconductor chip is disposed on the redistribution structure, and includes a connection terminal electrically connected to the plurality of redistribution layers. A connection bump is disposed on the pad structure, and electrically connects the connection terminal of the semiconductor chip and the pad structure to each other. The cavity includes a first sidewall adjacent to the at least a portion of the uppermost redistribution layer and a second sidewall opposite to the first sidewall. A first distance from the first sidewall to a center line of the pad structure is shorter than a second distance from the second sidewall to the center line of the pad structure.

BRIEF DESCRIPTION OF DRAWINGS

The above and other aspects and features of the present disclosure will be more clearly understood from the following detailed description, taken in conjunction with the accompanying drawings, wherein.

DETAILED DESCRIPTION

Hereinafter, with reference to the accompanying drawings, preferred embodiments of the present inventive concept will be described as follows. Unless otherwise specified, in this specification, terms such as ‘upper portion’, ‘upper surface’, ‘lower portion’, ‘lower surface’, ‘side surface', and the like, are based on the drawings, and may actually vary depending on a direction in which the components are arranged.

Figure 1:
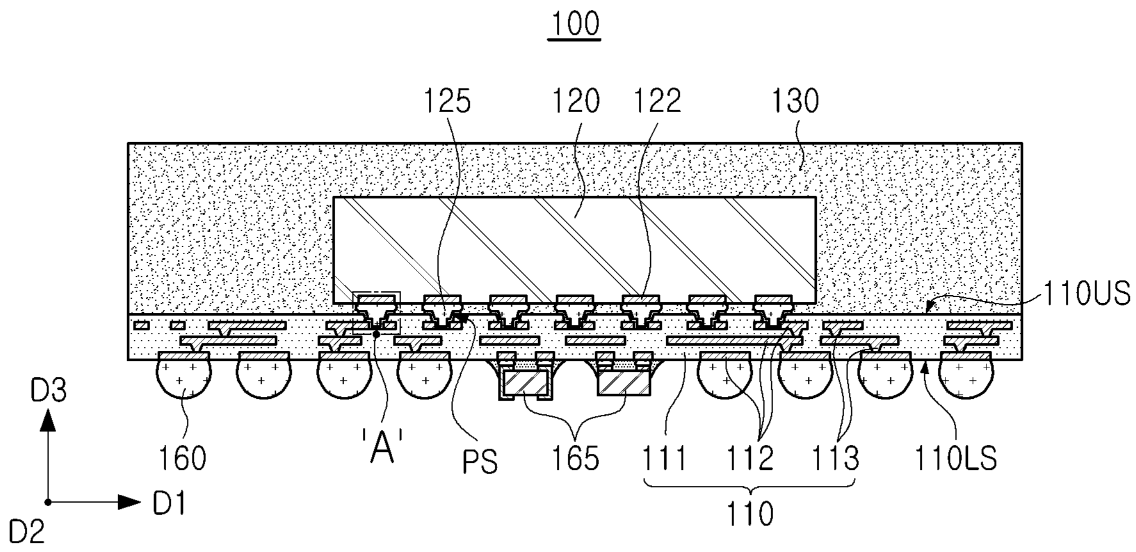
FIG. 1 is a cross-sectional view illustrating a semiconductor package according to an example embodiment of the present inventive concept.
Figure 2A:
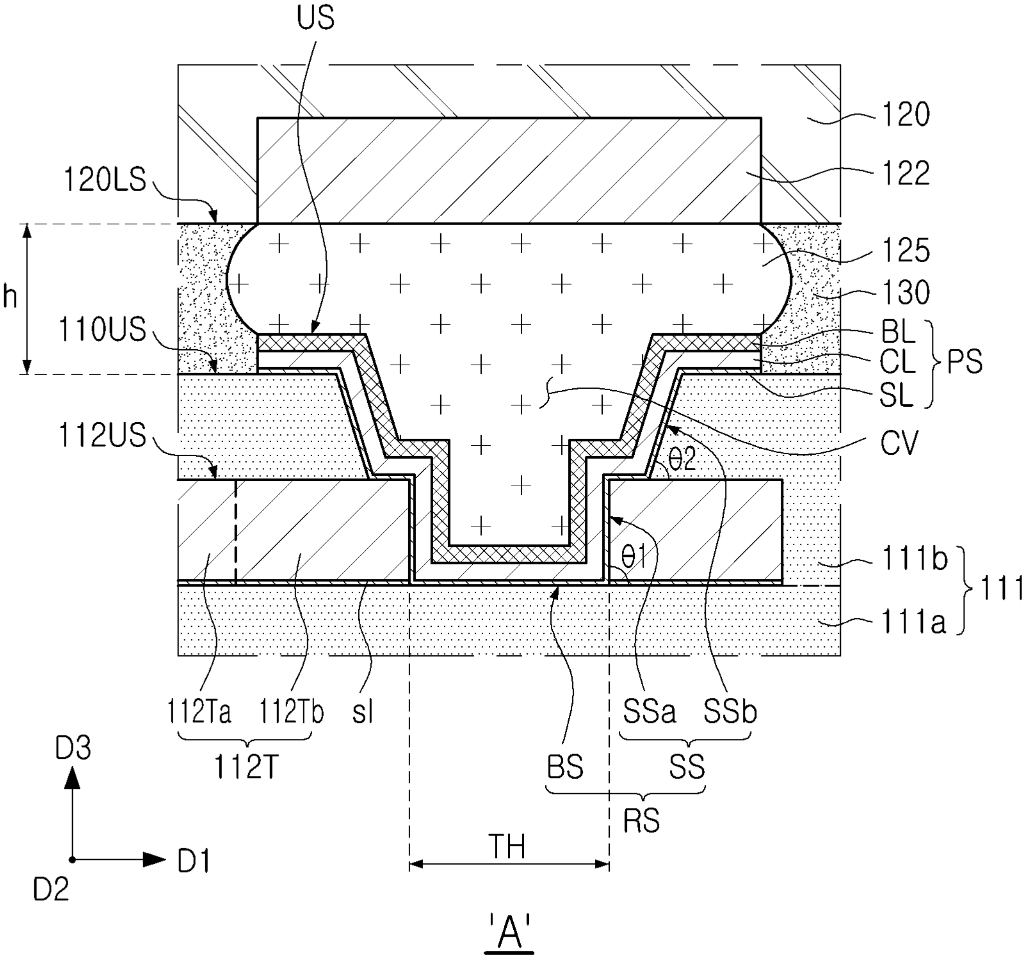
FIG. 2A is a partially enlarged view illustrating region ‘A’ of FIG. 1A.
Figure 2B:
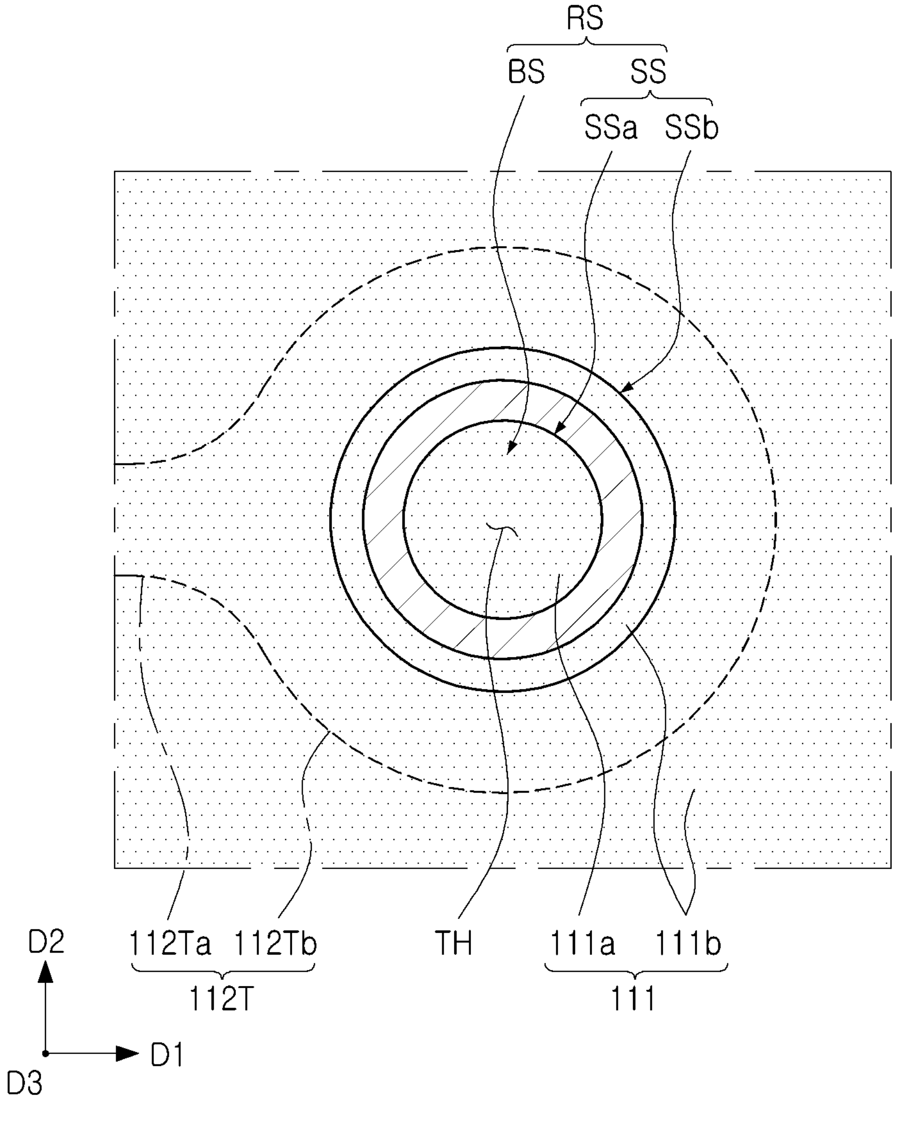
FIG. 2B is a plan view illustrating an uppermost redistribution layer and a recess shown in FIG. 2A.

FIG. 1 is a cross-sectional view illustrating a semiconductor package 100 according to an example embodiment of the present inventive concept, FIG. 2A is a partially enlarged view illustrating a region 'A' of FIG. 1A, and FIG. 2B is a plan view illustrating the uppermost redistribution layer 112T and the recess RS of FIG. 2A.

Referring to FIGS. 1, 2A, and 2B, the semiconductor package 100, according to an example embodiment, may include a redistribution structure 110, a semiconductor chip 120, connection bumps 125, and an encapsulant 130. In the present inventive concept, by introducing a pad structure PS having a cavity CV (or 'first pad structure'), a volume of the connection bump 125 may be increased and connection reliability between the semiconductor chip 120 and the redistribution structure 110 may be increased. As a distance between the semiconductor chip 120 and the redistribution structure 110 decreases, the volume of the connection bump 125 decreases, and connection reliability problems such as non-wetting may occur. According to example embodiments, even when the distance between the semiconductor chip 120 and the redistribution structure 110 is relatively narrow, the connection bump 125 is filled in the cavity CV, so that it is possible to prevent defects due to a decrease in a volume of the connection bump 125 and increase connection reliability.

The redistribution structure 110 is a support substrate on which the semiconductor chip 120 is mounted, and has an upper surface 100US and a lower surface 110LS opposite to the upper surface. The redistribution structure 110 may include an insulating layer 111, a plurality of redistribution layers 112, and redistribution vias 113. The redistribution structure 110 may include a recess RS exposing at least a portion of an uppermost redistribution layer 112T, among the plurality of redistribution layers 112, and a pad structure PS disposed within the recess RS (or a 'first pad structure').

The insulating layer 111 may define the upper surface 110US and the lower surface 110LS of the redistribution structure 110. The insulating layer 111 may surround at least a portion of each of the plurality of redistribution layers 112. The insulating layer 111 may include a plurality of layers stacked in a vertical direction (e.g., a direction D3). A boundary between the plurality of layers may be nebulous. The insulating layer 111 may include an insulating resin. The insulating resin may include a thermosetting resin such as an epoxy resin, a thermoplastic resin such as polyimide, or a resin impregnated with an inorganic filler in these resins, for example, prepreg, Ajinomoto Build-up Film (ABF), FR-4, BT, and the like. For example, the insulating layer 111 may include a photosensitive resin such as photo-imageable dielectric (PID).

The plurality of redistribution layers 112 may redistribute a connection terminal 122 of the semiconductor chip 120. The plurality of redistribution layers 112 may include, for example, a metal such as copper (Cu), aluminum (Al), silver (Ag), tin (Sn), gold (Au), nickel (Ni), lead (Pb), titanium (Ti), or an alloy thereof. A seed layer SL may be disposed on a lower surface of the plurality of redistribution layers 112. The plurality of redistribution layers 112 may perform various functions according to design. For example, the plurality of redistribution layers 112 may include a ground pattern, a power pattern, a signal pattern, and the like. Here, the signal pattern may provide a transmission path for various signals other than a ground pattern and a power pattern, and the like, for example, a data signal.

The redistribution vias 113 may extend within the insulating layer 111 and be electrically connected to the plurality of redistribution layers 112. For example, the redistribution vias 113 may interconnect a plurality of redistribution layers 112 at different levels. The redistribution vias 113 may include a signal via, a ground via, a power via, and the like. The redistribution vias 113 may include, for example, copper (Cu), aluminum (Al), silver (Ag), tin (Sn), gold (Au), nickel (Ni), lead (Pb), titanium (Ti), or alloys thereof. The redistribution vias 113 may be filled vias in which a metal is filled in a via hole or conformal vias in which a metal extends along an inner wall of the via hole.

The pad structure PS (or 'first pad structure') may extend from the upper surface 110US of the redistribution structure 110 (or the insulating layer 111) into the insulating layer 111 to be connected to at least a portion of an uppermost redistribution layer 112T of a plurality of redistribution layers 112. The pad structure PS may be conformally formed inside a recess RS to define a cavity CV that opens upwardly (direction of D3). Even when a distance between the semiconductor chip 120 and the redistribution structure 110 is narrowed, a space for accommodating the connection bump 125 is provided by the cavity CV, so that a volume of the connection bump 125 interposed between the connection terminal 122 and the pad structure PS may be increased, and connection reliability between the connection terminal 122 and the pad structure PS may be increased. A distance h between a lower surface 120LS of the semiconductor chip 120 on which the connection terminal 122 is disposed and an upper surface 110US of the insulating layer 111 may be about 20 μm or less, and may be in a range, for example, from about 1 μm to 20 μm, from about 1 μm to 15 μm, from about 1 μm to 10 μm, and the like. A height (or depth) of the cavity CV may be greater than the height from the upper surface US of the pad structure PS to the connection terminal 122. In FIG. 2A, a lower surface of the connection terminal 122 is illustrated to be on the same plane as a lower surface 120LS of the semiconductor chip 120, but an example embodiment thereof is not necessarily limited thereto. According to an example embodiment, the connection terminal 122 may protrude downwardly from the lower surface 120LS of the semiconductor chip 120.

The recess RS may extend from an upper surface 110US of the redistribution structure 110 into the insulating layer 111, to expose at least a portion of the uppermost redistribution layer 112T. The recess RS may have a bottom BS defined by a first insulating layer 111*a*, and an inner wall SS defined by the uppermost redistribution layer 112T and a second insulating layer 111*b*. Here, the first insulating layer 111*a* may be a portion of the insulating layer 111 disposed below the uppermost redistribution layer 112T, and the second insulating layer 111*b* may be a portion of the insulating layer 111 covering an upper surface and a side surface of the uppermost redistribution layer 112T on the first insulating layer 111*a*. A boundary between the first insulating layer 111*a* and the second insulating layer 111*b* might not be clearly distinguished.

The inner wall SS of the recess RS may have a lower region SSa defined by the side surface of the uppermost redistribution layer 112T and an upper region SSb defined by the insulating layer 111 (e.g., the second insulating layer 111*b*) on the upper surface 112US of the uppermost redistribution layer 112T. In an example embodiment, the lower region SSa of the recess RS may be defined by a through-hole TH penetrating the uppermost redistribution layer 112T. For example, the uppermost redistribution layer 112T may include a pattern portion 112Ta extending in a horizontal direction (e.g., D1 direction), and a landing portion 112Tb disposed at one end of the pattern portion 112Ta and having a through hole TH.

The recess RS may be of a predetermined size so that the cavity CV of the pad structure PS has a desired size. For example, a height from the upper surface 110US of the insulating layer 111 to the bottom BS of the recess RS may be greater than a height from the upper surface 110US of the insulating layer 111 to an upper surface 112US of an uppermost redistribution layer 112T. At least a portion of the pad structure PS and at least a portion of the connection bump 125 may be disposed within a lower region SSa of the recess RS and in a through-hole TH of the landing portion 112Tb. For example, the recess RS may completely expose the through-hole TH of the landing portion 112Tb. A width of an upper region SSb of the recess RS may be greater than a width of the lower region SSa of the recess RS. According to example embodiments, the upper region SSb may expose at least a portion of the upper surface 112US of the uppermost redistribution layer 112T, for example, a portion of the upper surface of the landing portion 112Tb (see FIG. 2A), but an example embodiment is not necessarily limited thereto (see FIG. 6). An inclination angle θ1 of the lower region SSa with respect to the bottom BS of the recess RS may be greater than an inclination angle θ2 of the upper region SSb. An upper region SSb of the recess RS may have a tapered shape toward the uppermost redistribution layer 112T.

The pad structure PS may include a metal including copper (Cu), aluminum (Al), silver (Ag), tin (Sn), gold (Au), nickel (Ni), lead (Pb), titanium (Ti), or alloys thereof. For example, the pad structure PS may include a first conductive layer SL, a second conductive layer CL, and a third conductive layer BL. The first conductive layer SL may conformally extend along at least a portion of the upper surface 110US of the insulating layer 111 and along a bottom BS and an inner wall SS of the recess RS. The second conductive layer CL may be disposed on the first conductive layer SL, and conformally extend along a surface of the first conductive layer SL. The third conductive layer BL may be disposed on the second conductive layer CL, and conformally extend along a surface of the second conductive layer CL. A thickness of each of the second conductive layer CL and the third conductive layer BL may be greater than a thickness of the first conductive layer SL. For example, the thickness of the first conductive layer SL may be about 0.1 μm or less, and the thicknesses of the second conductive layer CL and the third conductive layer BL may be about 1 μm or more, but an example embodiment thereof is not necessarily limited thereto. The first conductive layer SL, the second conductive layer CL, and the third conductive layer BL may include metals of different types. For example, the first conductive layer SL may include titanium (Ti) or an alloy of titanium (Ti), the second conductive layer CL may include copper (Cu) or an alloy of copper (Cu), and the third conductive layer BL may include nickel (Ni) or an alloy of nickel (Ni).

The semiconductor chip 120 may be disposed on the upper surface 110US of the redistribution structure 110, and include a connection terminal 122 electrically connected to the plurality of redistribution layers 112. The semiconductor chip 120 may be an integrated circuit (IC) in a bare state in which no separate bumps or interconnection layers are formed, but an example embodiment thereof is not necessarily limited thereto, and may be a packaged type integrated circuit. The integrated circuit may be a processor chip such as a central processor (CPU), a graphics processor (GPU), a field programmable gate array (FPGA), an application processor (AP), a digital signal processor, a cryptographic processor, a microprocessor, a microcontroller, and the like, but the present inventive concept is not necessarily limited thereto, and may be a logic chip such as an analog-to-digital converter, an application-specific IC (ASIC), and the like, and a memory chip including a volatile memory such as dynamic RAM (DRAM), static RAM (SRAM), and the like, and a non-volatile memory such as phase change RAM (PRAM), magnetic RAM (MRAM), Resistive RAM (RRAM), flash memory, and the like.

The connection bump 125 may be disposed between the semiconductor chip 120 and the redistribution structure 110, and electrically connect the connection terminal 122 of the semiconductor chip 120 and the pad structure PS of the redistribution structure 110. The connection bump 125 may be disposed within a cavity CV of the pad structure PS. The connection bump 125 may fill a space between the connection terminal 122 and the pad structure PS and an inside of the cavity CV. The connection bump 125 may increase connection reliability between the semiconductor chip 120 and the redistribution structure 110 by filling the inside of the cavity CV. Accordingly, a lower surface of the connection bump 125 may be on a lower level than the upper surface 112US of the uppermost redistribution layer 112T. The connection bump 125 may include a low melting point metal, for example, tin (Sn) or an alloy including tin (Sn) (e.g., Sn—Ag—Cu).

According to example embodiments, an underfill layer may be disposed between the semiconductor chip 120 and the redistribution structure 110. The underfill layer may include an insulating resin such as an epoxy resin, and may physically and electrically protect connection bumps 125. The underfill layer may have a capillary underfill (CUF) structure, but an example embodiment thereof is not necessarily limited thereto. Depending on the example embodiment, the underfill layer may have a molded underfill (MUF) structure integrated with an encapsulant 130.

The encapsulant 130 may cover at least a portion of the semiconductor chip 120 on the redistribution structure 110. The encapsulant 130 may include, for example, a thermosetting resin such as an epoxy resin, a thermoplastic resin such as polyimide, or a prepreg impregnated with an inorganic filler in these resins, ABF, FR-4, BT, and an Epoxy Molding Compound (EMC).

External connection bumps 160 may be disposed on a lower surface 110LS of the redistribution structure 110. The external connection bumps 160 may be electrically connected to a plurality of redistribution layers 112. The semiconductor package 100 may be connected to external devices such as a module substrate, a system board, and the like, through external connection bumps 160. The external connection bumps 160 may include, for example, tin (Sn) or an alloy (Sn—Ag—Cu) containing tin (Sn). According to the example embodiment, a resist layer may be formed on the lower surface 110LS of the redistribution structure 110 to protect the external connection bumps 160 from physical and chemical damage.

In addition, at least one passive device 165 may be disposed below the redistribution structure 110. The passive device 165 may include, for example, a capacitor, an inductor, beads, and the like. The passive device 165 may be flip-chip bonded. The passive device 165 may be electrically connected to the redistribution layer 112 through solder bumps, or the like. An underfill resin may be filled between the passive device 165 and the redistribution structure 110.

Figure 3:
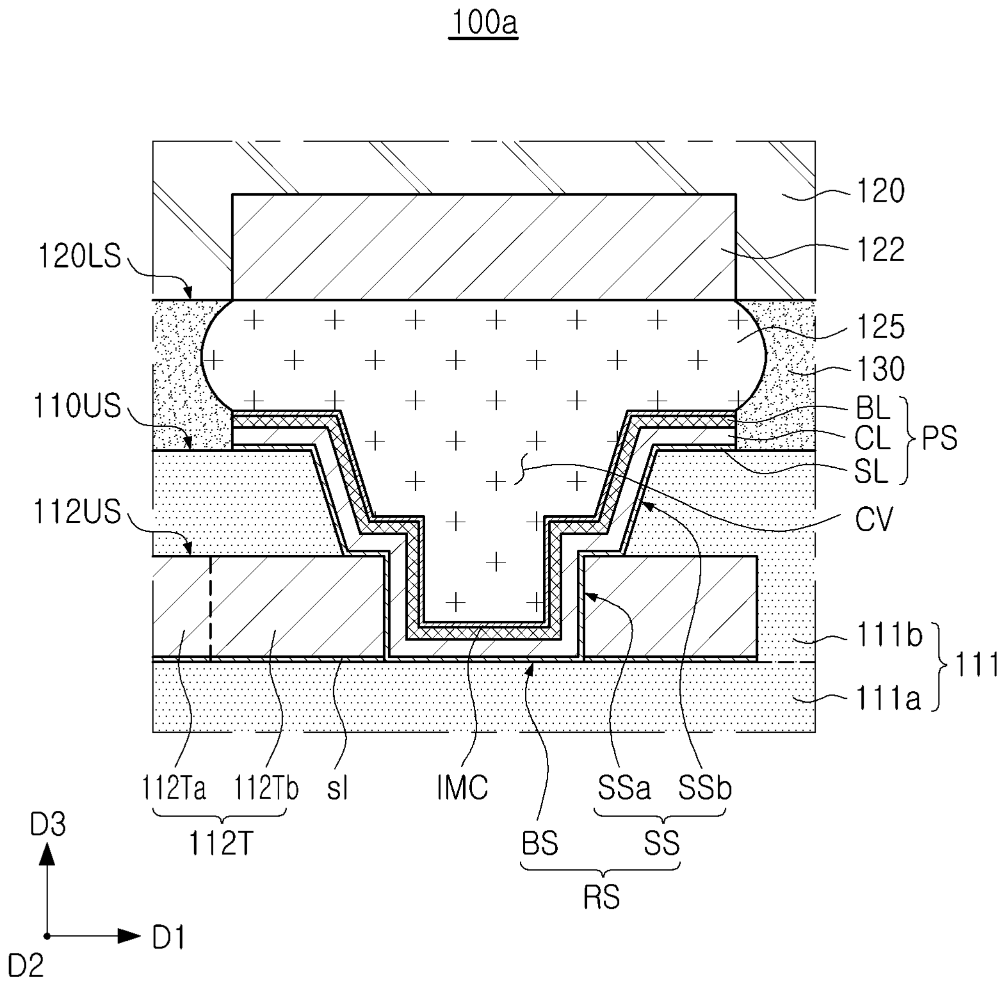
FIG. 3 is a partially enlarged view illustrating a semiconductor package according to an example embodiment of the present inventive concept.

FIG. 3 is a partially enlarged view illustrating a semiconductor package 100*a* according to an example embodiment. FIG. 3 illustrates a partial region of a semiconductor package 100*a* of an example embodiment corresponding to FIG. 2A.

Referring to FIG. 3, the semiconductor package 100*a*, according to an example embodiment, may have the same or similar characteristics as those described with reference to FIGS. 1 to 2B except that an intermetallic compound (IMC) is formed between a pad structure PS and a connection bump 125. The semiconductor package 100*a* may further include an intermetallic compound layer IMC between the pad structure PS and the connection bump 125. The intermetallic compound layer IMC may be formed at an interface between the third conductive layer BL of the pad structure PS and the connection bump 125. The intermetallic compound layer IMC may be a compound of a metal (e.g., nickel (Ni)) constituting the third conductive layer BL and a metal (e.g., tin (Sn)) constituting the connection bump 125. A thickness of the intermetallic compound layer IMC may be smaller than that of each of the second conductive layer CL and the third conductive layer BL.

Figure 4:
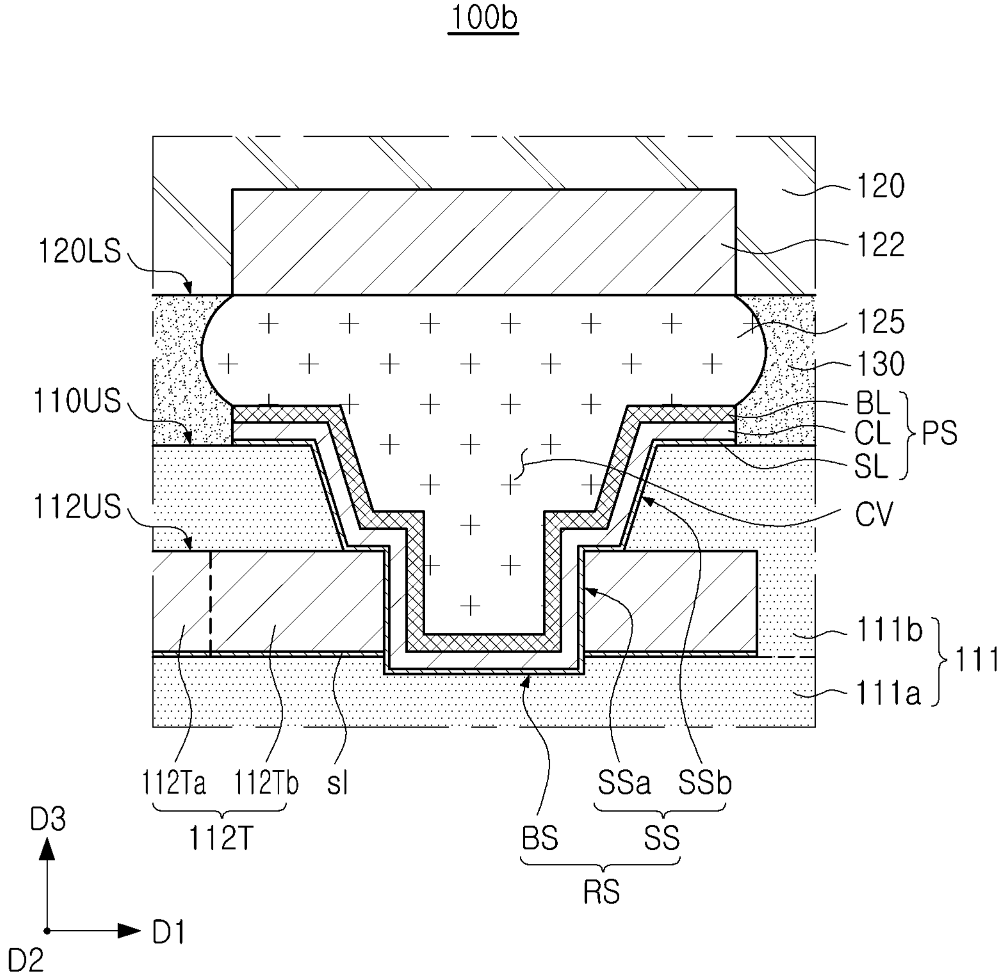
FIG. 4 is a partially enlarged view illustrating a semiconductor package according to an example embodiment of the present inventive concept.

FIG. 4 is a partially enlarged view illustrating a semiconductor package 100*b* according to an example embodiment. FIG. 4 illustrates a partial region of the semiconductor package 100*b* of an example embodiment corresponding to FIG. 2A.

Referring to FIG. 4, the semiconductor package 100*b* may have the same or similar characteristics as those described with reference to FIGS. 1 to 3, except that a bottom BS of a recess RS is disposed on a level that is lower than a lower surface of an uppermost redistribution layer 112T. A depth of the recess RS may be greater than a depth from an upper surface 110US of the insulating layer 111 to the lower surface of the uppermost redistribution layer 112T. The recess RS may penetrate a second insulating layer 111*b*, and may extend into a first insulating layer 111*a*. For example, the lower surface of the cavity CV may be disposed on a level that is higher than the lower surface of the uppermost redistribution layer 112T, but the present disclosure is not necessarily limited thereto. According to the example embodiment, the lower surface of the cavity CV and/or the lower surface of the connection bump 125 may be on a lower level than the lower surface of the uppermost redistribution layer 112T.

Figure 5:
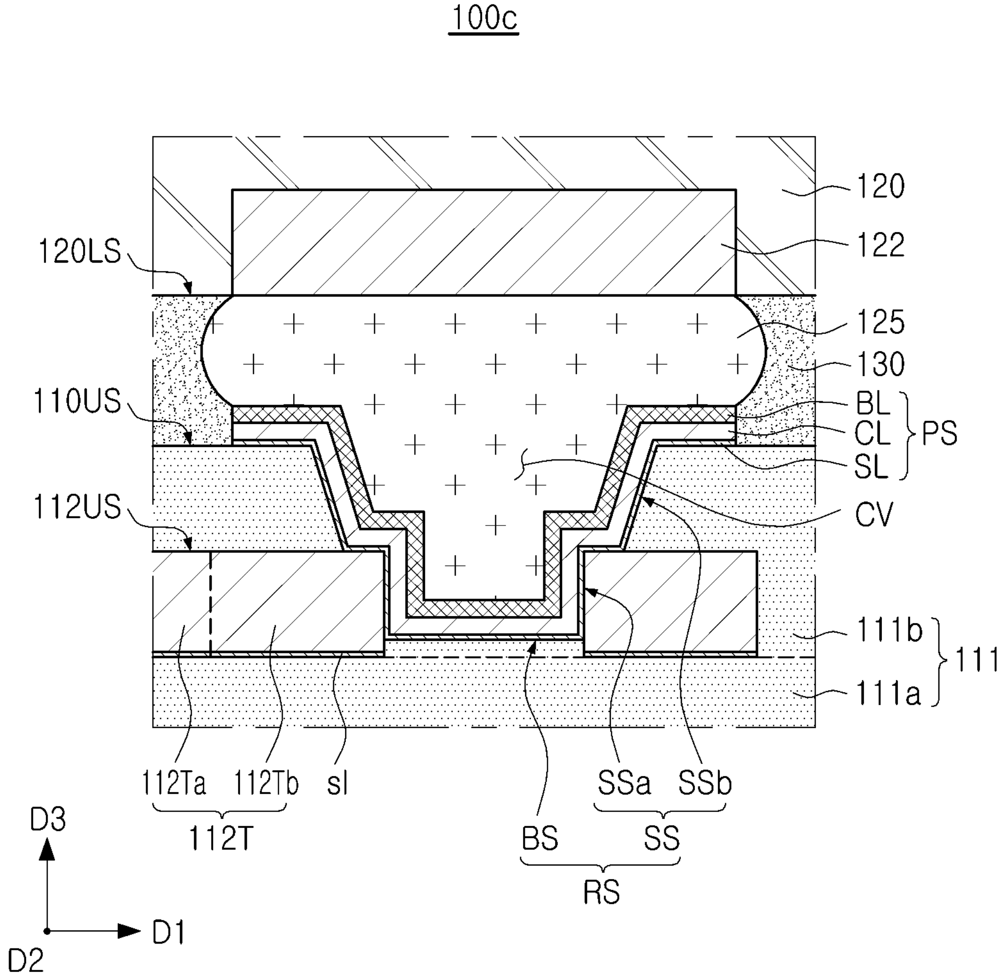
FIG. 5 is a partially enlarged view illustrating a semiconductor package according to an example embodiment of the present inventive concept.

FIG. 5 is a partially enlarged view illustrating a semiconductor package 100*c* according to an example embodiment. FIG. 5 illustrates a partial region of a semiconductor package 100*c* of an embodiment corresponding to FIG. 2A.

Referring to FIG. 5, the semiconductor package 100*c*, according to an example embodiment, may have the same or similar characteristics as those described above with reference to FIGS. 1 to 4 except that a bottom BS of the recess RS is disposed on a level higher than a lower surface of the uppermost redistribution layer 112T. A depth of the recess RS may be smaller than a depth from the upper surface 110US of the insulating layer 111 to the lower surface of the uppermost redistribution layer 112T. The recess RS may extend only to a partial region of a second insulating layer 111*b*. However, the bottom BS of the recess RS may be disposed on a level lower than an upper surface 112US of the uppermost redistribution layer 112T. For example, the bottom BS of the recess RS may be disposed between the upper surface 112US of the uppermost redistribution layer 112T and the lower surface of the uppermost redistribution layer 112T. In addition, the lower surface of the cavity CV and/or the lower surface of the connection bump 125 may be disposed between the upper surface 112US of the uppermost redistribution layer 112T and the lower surface of the uppermost redistribution layer 112T.

Figure 6:
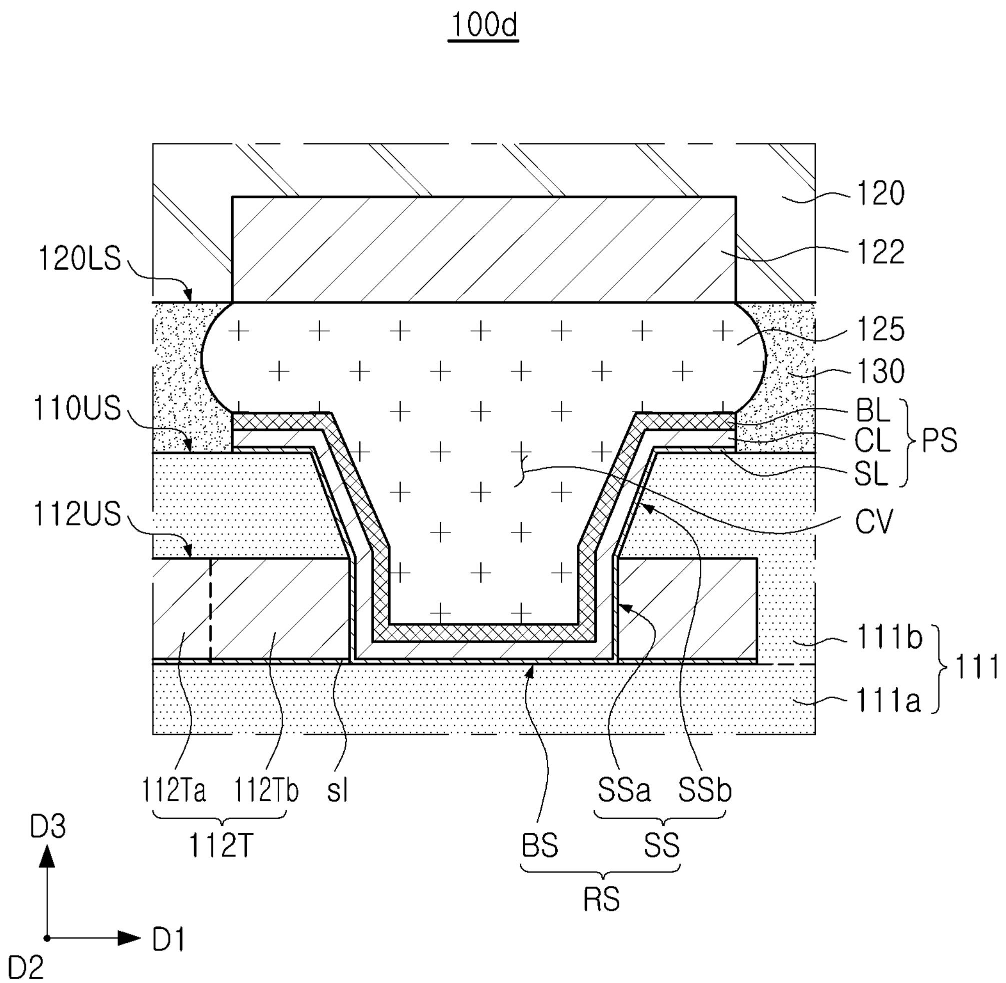
FIG. 6 is a partially enlarged view illustrating a semiconductor package according to an example embodiment of the present inventive concept.

FIG. 6 is a partially enlarged view illustrating a semiconductor package 100*d* according to an example embodiment. FIG. 6 illustrates a partial region of a semiconductor package 100*d* of an example embodiment corresponding to FIG. 2A.

Referring to FIG. 6, the semiconductor package 100*d*, according to an example embodiment, may have the same or similar characteristics as those described above with reference to FIGS. 1 to 5 except that an upper surface 112US of the uppermost redistribution layer 112T is not exposed by a recess RS. The recess RS may expose only a side surface of a through-hole penetrating a landing portion 112Tb. An inner wall SS of the recess RS may have a lower region SSa defined by a side surface of the uppermost redistribution layer 112T and an upper region SSb defined by the second insulating layer 111*b*. The inner wall SS of the recess RS may have a bent shape between the lower a region SSa and the upper region SSb.

Figure 7A:
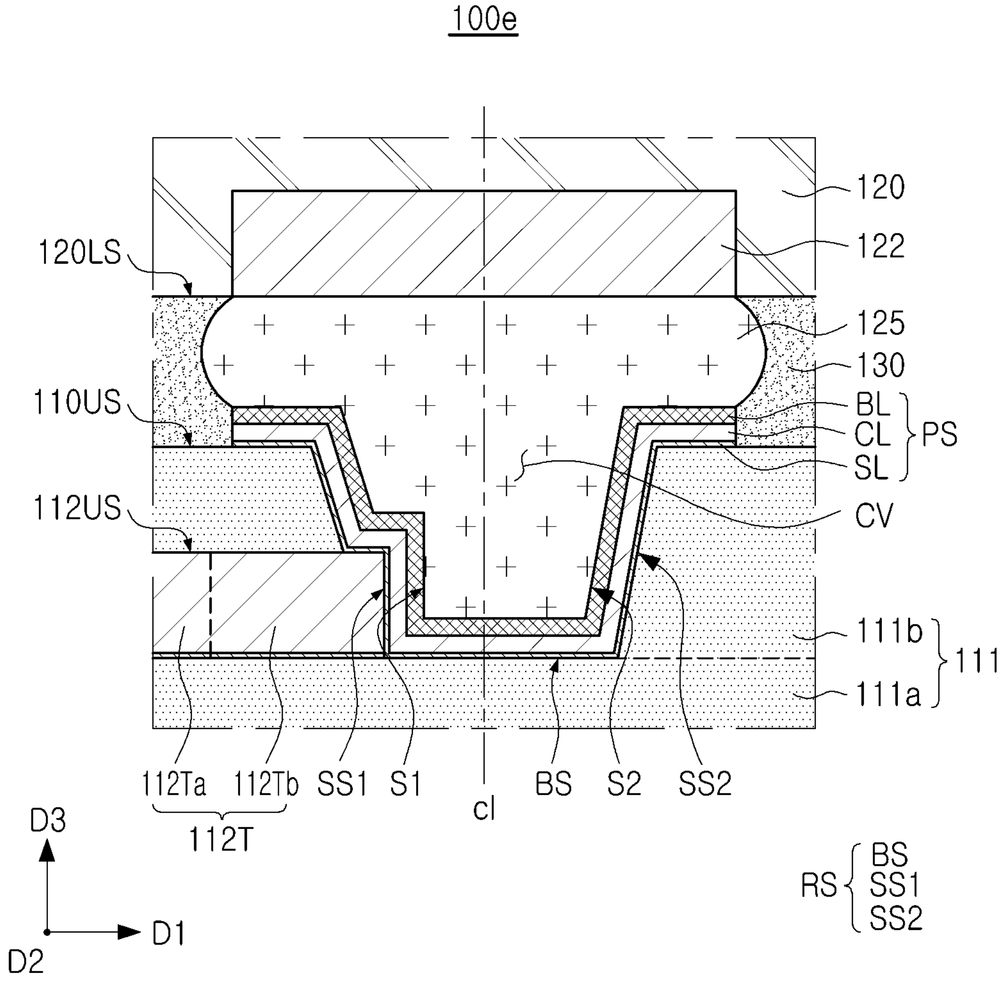
FIG. 7A is a partially enlarged view of a semiconductor package according to an example embodiment.
Figure 7B:
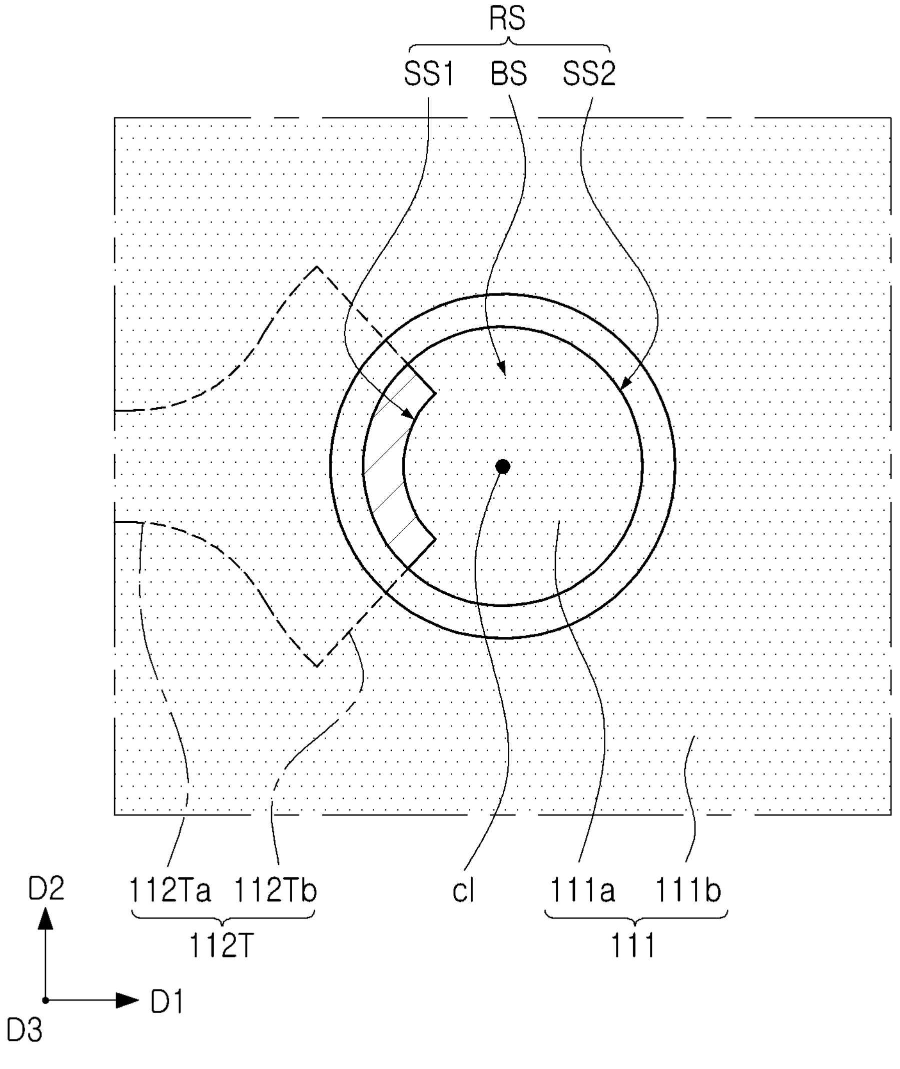
FIGS. 7B and 7C are plan views illustrating an uppermost redistribution layer and a recess of FIG. 7A.
Figure 7C:
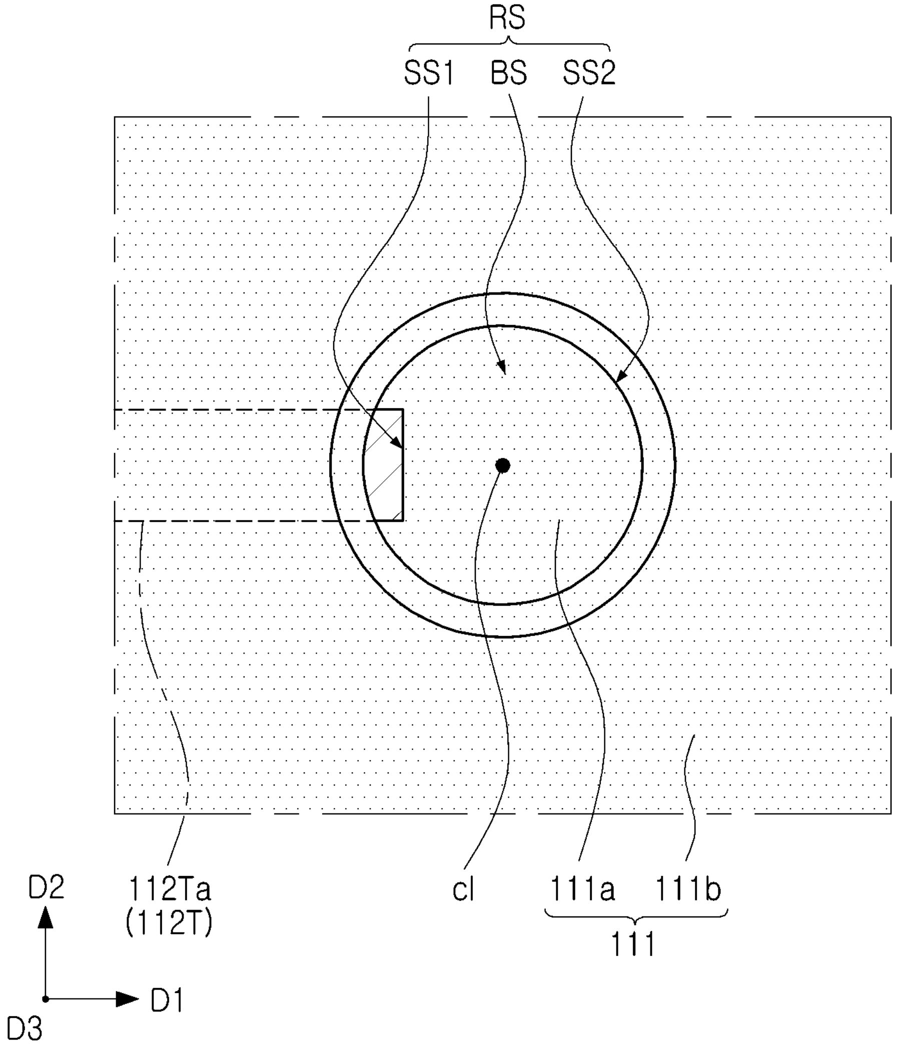

FIG. 7A is a partially enlarged view of a semiconductor package 100*e* according to an example embodiment, and FIGS. 7B and 7C are plan views illustrating an uppermost redistribution layer and a recess of FIG. 7A. FIG. 7A illustrates a partial region of a semiconductor package 100*e* of an example embodiment corresponding to FIG. 2A.

Referring to FIGS. 7A, 7B, and 7C, the semiconductor package 100*e*, according to an example embodiment, may have the same or similar characteristics as those described above with reference to FIGS. 1 to 6 except for including an asymmetrical pad structure PS. The pad structure PS may have an asymmetric structure with respect to a center line c1 in at least a partial region. For example, the recess RS may include a first side SS1 defined by an uppermost redistribution layer 112T and an insulating layer 111 on the upper surface 112US of the uppermost redistribution layer 112T and a second side SS2 defined only the insulating layer 111. The first side SS1 and the second side SS2 may be asymmetrical with respect to the center line c1 of the pad structure PS. In addition, the cavity CV has a first sidewall S1 adjacent to at least a portion of the uppermost redistribution layer 112T and a second sidewall S2 opposite to the first sidewall S1, and a first distance from the first sidewall S1 to the center line c1 of the pad structure PS may be smaller than a second distance from the second sidewall S2 to the center line c1 of the pad structure PS. The uppermost redistribution layer 112T has a form in which at least a portion of a landing portion 112Tb is cut (see FIG. 7B) or a form consisting only of a pattern portion 112Ta extending in a horizontal direction (e.g., the D1 direction) (see FIG. 7C), but an example embodiment thereof is not necessarily limited thereto. As an accommodation space of the connection bump 125 is expanded on one side of the cavity CV by the asymmetric structure of the pad structure PS, the volume of the connection bump 125 may be further increased and connection reliability may be increased.

Figure 8A:
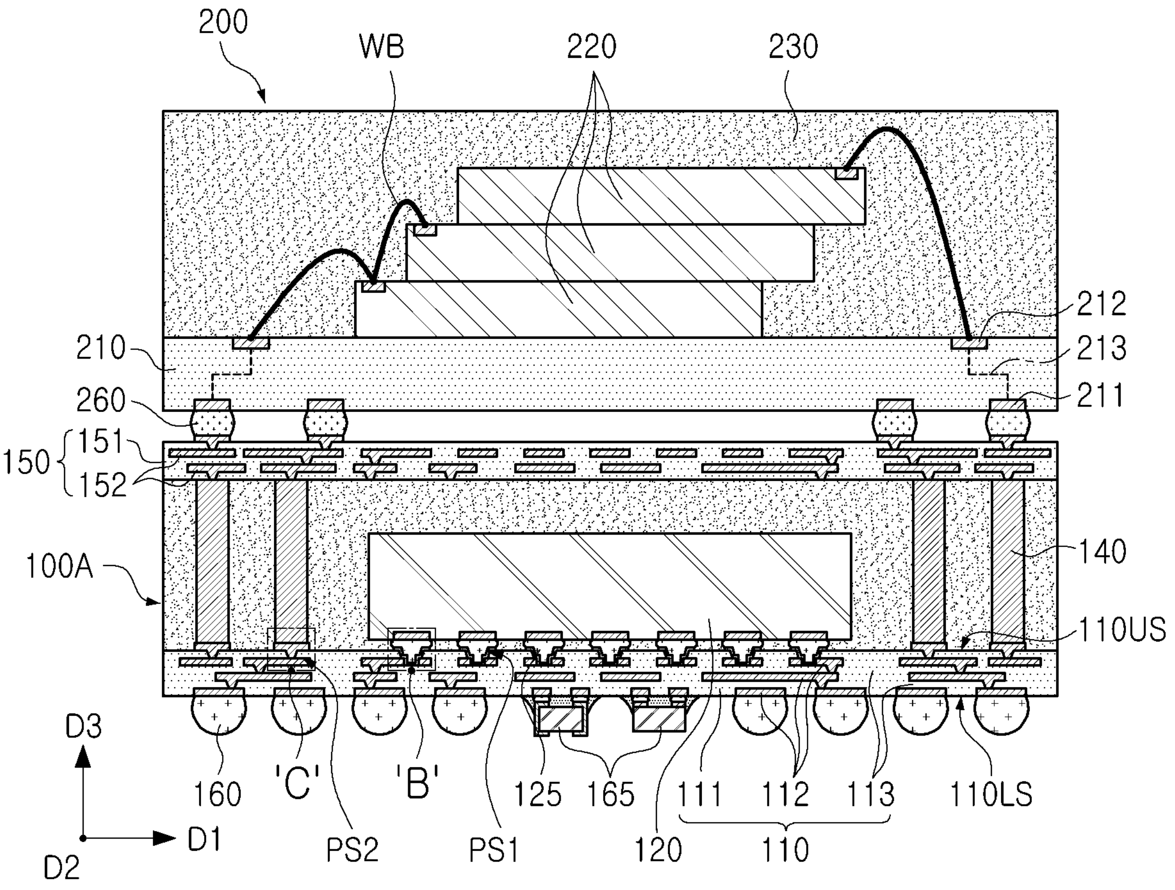
FIG. 8A is a cross-sectional view illustrating a semiconductor package according to an example embodiment of the present inventive concept.
Figure 8B:
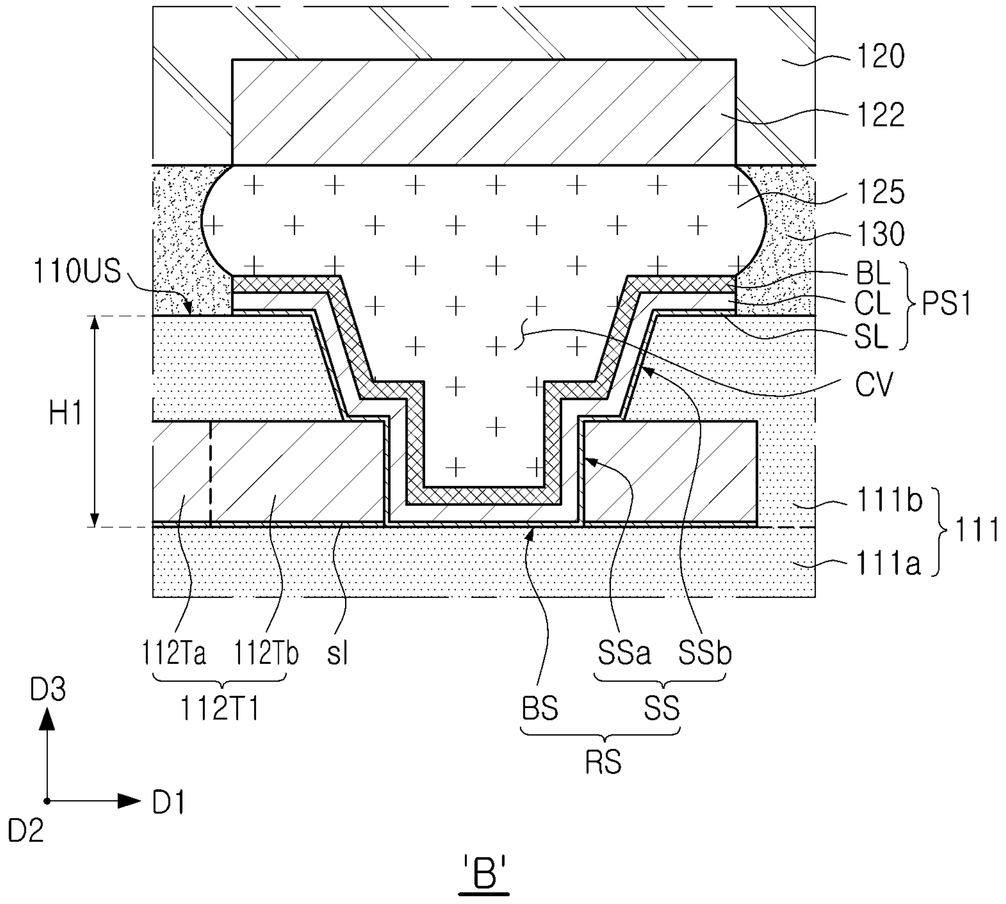
FIGS. 8B to 8C are partially enlarged views illustrating regions ‘B’ and ‘C’ of FIG. 8A, respectively.
Figure 8C:
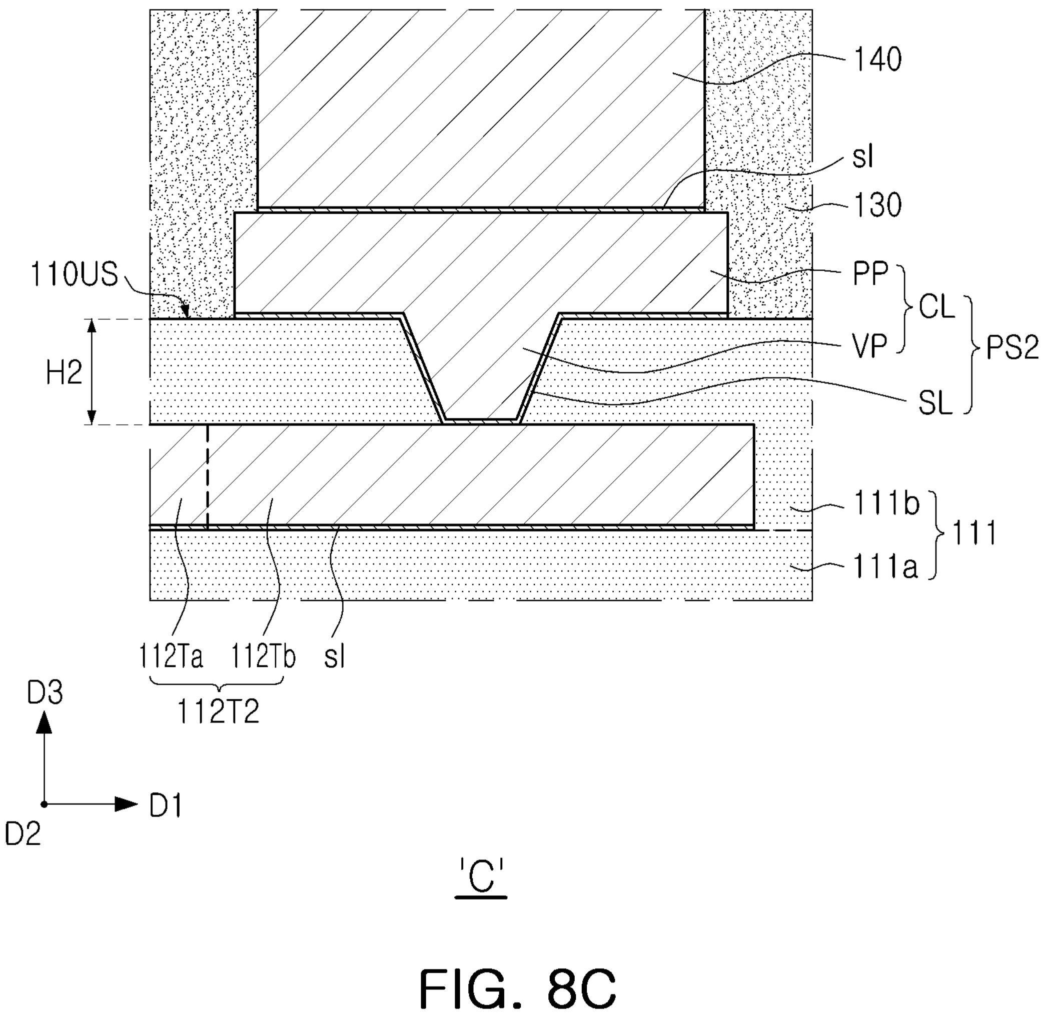

FIG. 8A is a cross-sectional view illustrating a semiconductor package 100A, according to an example embodiment, and FIGS. 8B and 8C are partially enlarged views illustrating regions 'B' and 'C' of FIG. 8A, respectively.

Referring to FIGS. 8A, 8B, and 8C, the semiconductor package 100A, according to an example embodiment, may have the same or similar features to those described with reference to FIGS. 1 to 7C, except for further including a through-via 140 and a second pad structure PS2.

In the present embodiment, the redistribution structure 110 may include a first pad structure PS1 connected to the first uppermost redistribution layer 112T1 and a second pad structure PS2 connected to the second uppermost redistribution layer 112T2. The first pad structure PS1 may include the pad structures PS described with reference to FIGS. 1 to 7C. The first pad structure PS1 and the second pad structure PS2 may have different shapes. The first pad structure PS1 may provide an upwardly open cavity CV. The second pad structure PS2 may provide a flat surface on which through-vias 140 are seated. Therefore, a height H2 from the upper surface 110US of the insulating layer 111 to the lower surface of the second pad structure PS2 may be smaller than the height H1 from the upper surface 110US of the insulating layer 111 to the lower surface of the first pad structure PS1.

The second pad structure PS2 may include a first conductive layer SL and a second conductive layer CL. The second conductive layer CL may include a pad portion PP disposed on the upper surface 110US of the redistribution structure 110, and a via portion VP extending from the pad portion PP into the insulating layer 111 and connected to a second uppermost redistribution layer 112T2 of the plurality of redistribution layers 112. The first conductive layer SL may be disposed between the lower surface of the second conductive layer CL, the insulating layer 111, and the second uppermost redistribution layer 112T2. The second pad structure PS2 may include a metal such as copper (Cu), aluminum (Al), silver (Ag), tin (Sn), gold (Au), nickel (Ni), lead (Pb), titanium (Ti), or alloys thereof. For example, the first conductive layer SL may include titanium (Ti) or an alloy of titanium (Ti), and the second conductive layer CL may include copper (Cu) or an alloy of copper (Cu).

The through-via 140 may be disposed on the second pad structure PS2, and extend vertically (e.g., in a D3 direction) within an encapsulant 130. An upper surface of the through-via 140 may be exposed from the encapsulant 130, and may be substantially coplanar with an upper surface of the encapsulant 130. For example, the through-via 140 may have a shape of posts penetrating the encapsulant 130. However, the shape of the through-via 140 is not necessarily limited thereto. The through-via 140 may include a metal such as copper (Cu). According to the example embodiment, a seed layer SL including titanium (Ti), copper (Cu), or the like may be formed on the lower surface of the through-via 140.

According to example embodiments, the semiconductor package 100A may further include an upper redistribution structure 150 and/or an upper package 200.

The upper redistribution structure 150 may be disposed on the semiconductor chip 120 and the encapsulant 130, and may include an upper insulating layer 151 and an upper redistribution layer 152. The upper insulating layer 151 may include an insulating resin. The insulating resin may include a thermosetting resin such as an epoxy resin, a thermoplastic resin such as polyimide, or a resin impregnated with an inorganic filler in these resins, for example, prepreg, ABF, FR-4, BT, and PID. The upper insulating layer 151 may include a plurality of layers stacked in a vertical direction (direction D3). According to the process, a boundary between the plurality of layers may be unclear. The upper redistribution layer 152 may be disposed on or within the upper insulating layer 151, and may redistribute the through-vias 140. The upper redistribution layer 152 may include, for example, a metal such as copper (Cu), aluminum (Al), silver (Ag), tin (Sn), gold (Au), nickel (Ni), lead (Pb), titanium (Ti), or an alloy thereof. The upper redistribution layer 152 may be electrically connected to the through-vias 140 through redistribution vias extending within the upper insulating layer 151. The upper redistribution layer 152 may include more or fewer redistribution layers than shown in the drawing.

The upper package 200 may include a substrate 210, an upper semiconductor chip 220, and an upper encapsulant 230. The substrate 210 may include a lower pad 211 and an upper pad 212 electrically connected to the outside on the lower and upper surfaces, respectively. In addition, the substrate 210 may include an interconnection circuit 213 electrically connecting the lower pad 211 and the upper pad 212.

The upper semiconductor chip 220 may be mounted on the substrate 210 by wire bonding or flip chip bonding. For example, the plurality of upper semiconductor chips 220 may be vertically stacked on the substrate 210, and electrically connected to the upper pad 212 of the substrate 210 by a bonding wire WB. In an example, the upper semiconductor chip 220 may include a memory chip, and the semiconductor chip 120 of the semiconductor package 100A may include an AP chip.

The upper encapsulant 230 may include the same or similar material as the encapsulant 130 of the semiconductor package 100A. The upper package 200 may be physically and electrically connected to the semiconductor package 100A by a conductive bump 260. The conductive bump 260 may be electrically connected to the interconnection circuit 213 through the lower pad 211 of the substrate 210. The conductive bump 260 may include a low-melting point metal, for example, tin (Sn) or an alloy containing tin (Sn).

FIGS. 9A to 9G are cross-sectional views schematically illustrating a manufacturing process of a pad structure PS applied to the semiconductor package 100 according to an example embodiment of the present inventive concept.

Figure 9A:
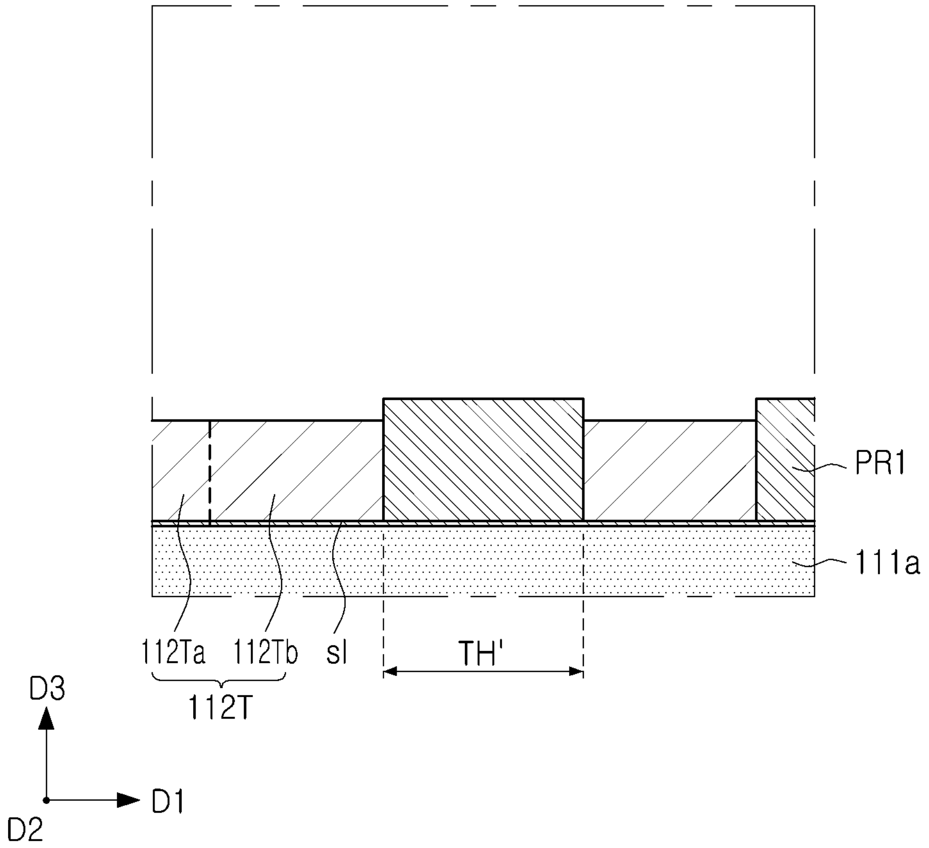
FIGS. 9A to 9G are cross-sectional views schematically illustrating a manufacturing process of a pad structure applied to a semiconductor package according to an example embodiment of the present inventive concept.

Referring to FIG. 9A, an uppermost redistribution layer 112T having a preliminary through-hole PH' may be formed on a first insulating layer 111*a* using a first photoresist layer PR1. The first photoresist layer PR1 may be patterned using a photolithography process. The uppermost redistribution layer 112T may include a pattern portion 112Ta and a landing portion 112Tb. The preliminary through-hole PH' may penetrate the landing portion 112Tb. The uppermost redistribution layer 112T may be formed by plating (e.g., an electroplating process) a metal layer on a seed layer SL. The seed layer SL may be formed using a process such as electroless plating, chemical vapor deposition (CVD), physical vapor deposition (PVD), and the like. The seed layer SL may be formed using, for example, a sputtering process. Thereafter, portions of the first photoresist layer PR1 and the seed layer SL may be removed to form a through-hole TH.

Figure 9B:
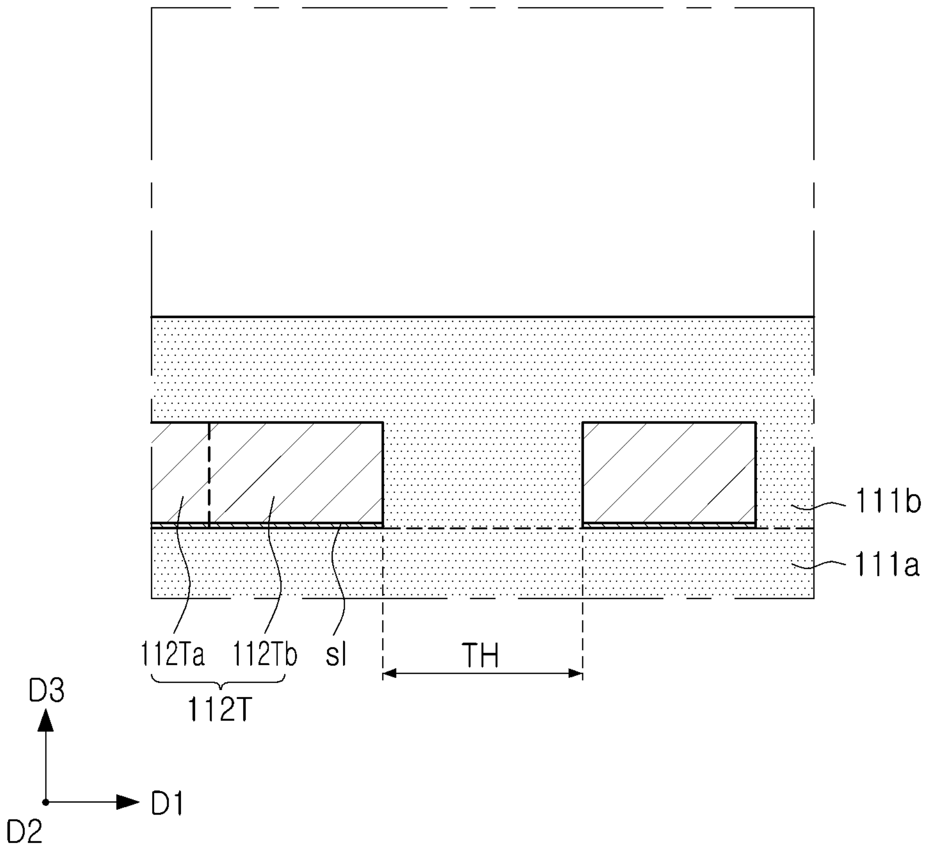

Referring to FIG. 9B, a second insulating layer 111*b* covering the uppermost redistribution layer 112T may be formed. The second insulating layer 111*b* may be formed by coating and curing a photosensitive resin, for example, PID. The second insulating layer 111*b* may fill an inside of the through-hole TH penetrating the uppermost redistribution layer 112T. According to the process, a boundary between the first insulating layer 111*a* and the second insulating layer 111*b* might not be clearly distinguished.

Figure 9C:
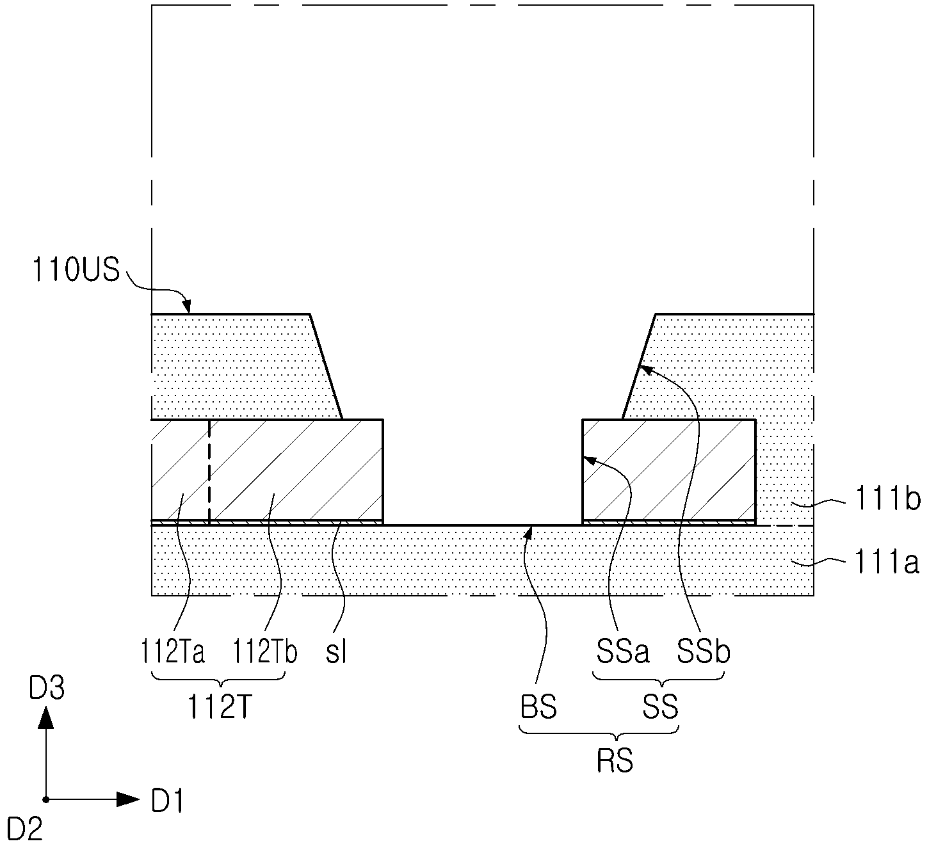

Referring to FIG. 9C, a recess RS exposing at least a portion of the uppermost redistribution layer 112T may be formed. The recess RS may be formed by an exposure process, a developing process, and the like. The recess RS may extend from an upper surface 110US to expose a first insulating layer 111*a* and a landing portion 112Tb. The recess RS may include a lower region SSa defined by the uppermost redistribution layer 112T and an upper region SSb defined by the second insulating layer 111*b*. A width of the upper region SSb of the recess RS may be greater than a width of the lower region SSa. Accordingly, the recess RS may expose at least a portion of the upper surface of the uppermost redistribution layer 112T. Depending on the example embodiment, a bottom surface BS of the recess RS may be formed lower or higher than a lower surface of the uppermost redistribution layer 112T.

Figure 9D:
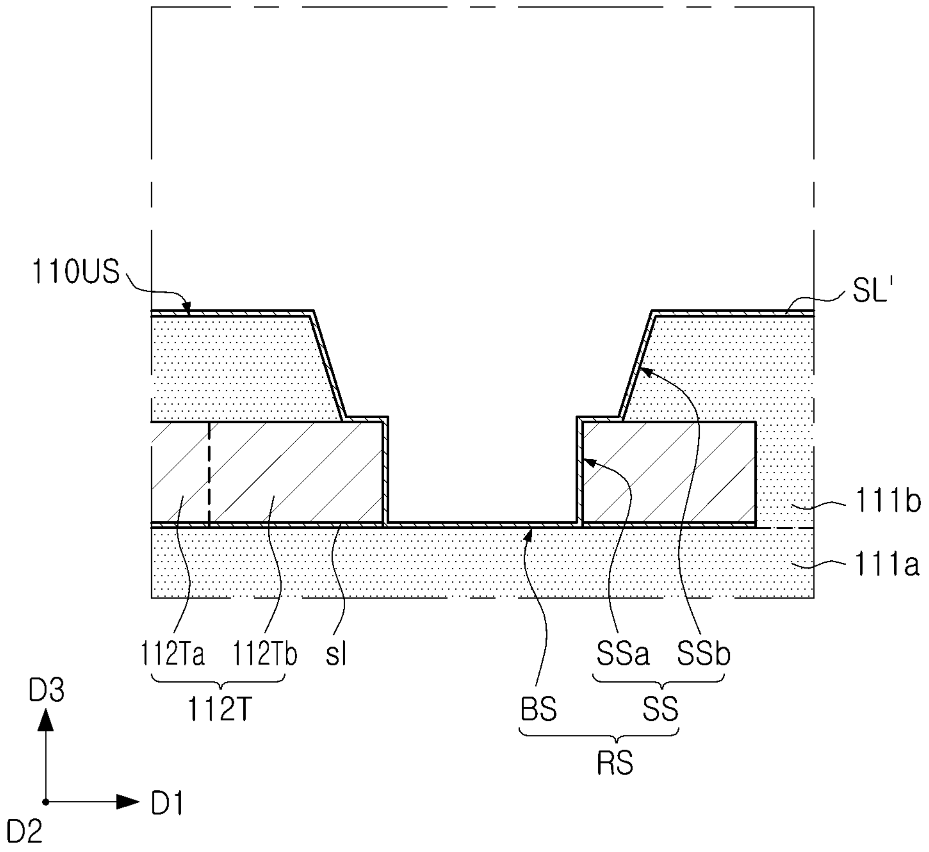

Referring to FIG. 9D, a preliminary seed layer SL' extending along the upper surface 110US of the insulating layer, the bottom surface BS of the recess RS, and an inner wall SS may be formed. The preliminary seed layer SL' may be formed by depositing a metal such as titanium (Ti) or copper (Cu). The preliminary seed layer SL' may be formed using a process such as electroless plating, CVD, PVD, or the like.

Figure 9E:
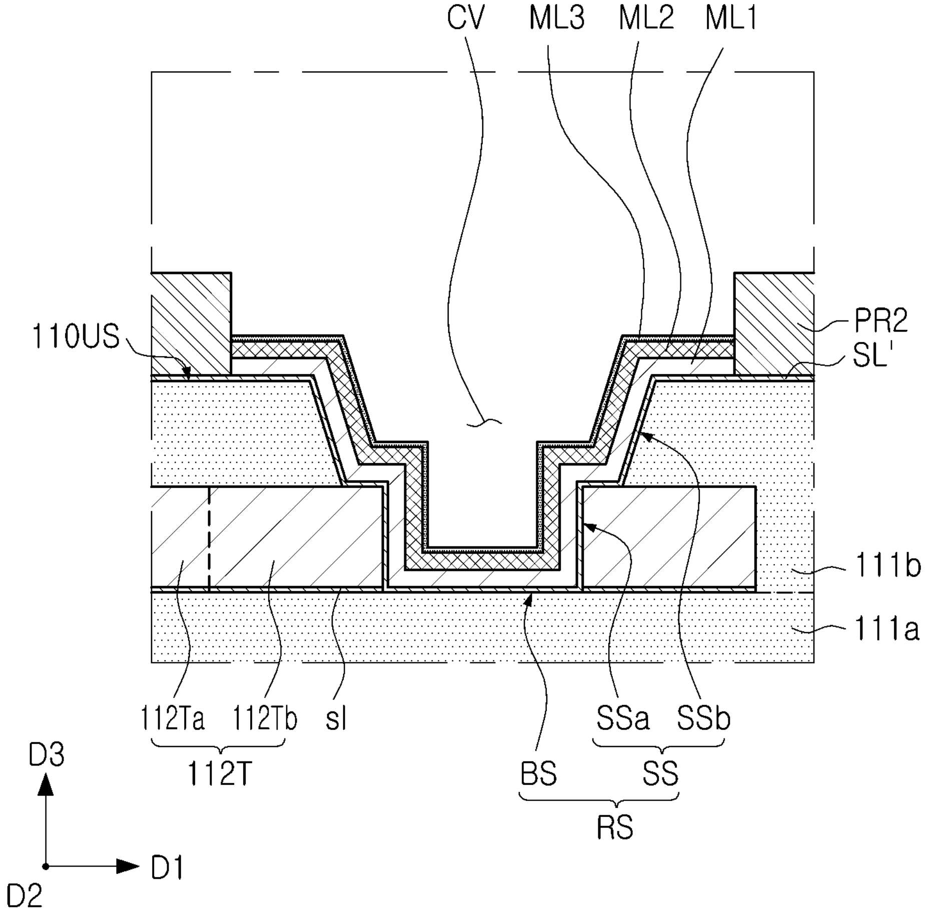

Referring to FIG. 9E, a first metal layer ML1, a second metal layer ML2, and a third metal layer ML3 may be sequentially formed on the preliminary seed layer SL. The first metal layer ML1, the second metal layer ML2, and the third metal layer ML3 may be conformally formed along a surface of the recess RS. Accordingly, a cavity CV corresponding to the recess RS may be formed by the first metal layer ML1, the second metal layer ML2, and the third metal layer ML3. The first metal layer ML1, the second metal layer ML2, and the third metal layer ML3 may be formed by plating a metal in the patterned second photoresist layer PR2 (e.g., an electroplating process). The first metal layer ML1 may include copper (Cu) or an alloy of copper (Cu), the second metal layer ML2 may include nickel (Ni) or an alloy of nickel (Ni), and the third metal layer ML3 may include gold (Au) or an alloy of gold (Au). Thereafter, a second photoresist layer PR2 may be removed.

Figure 9F:
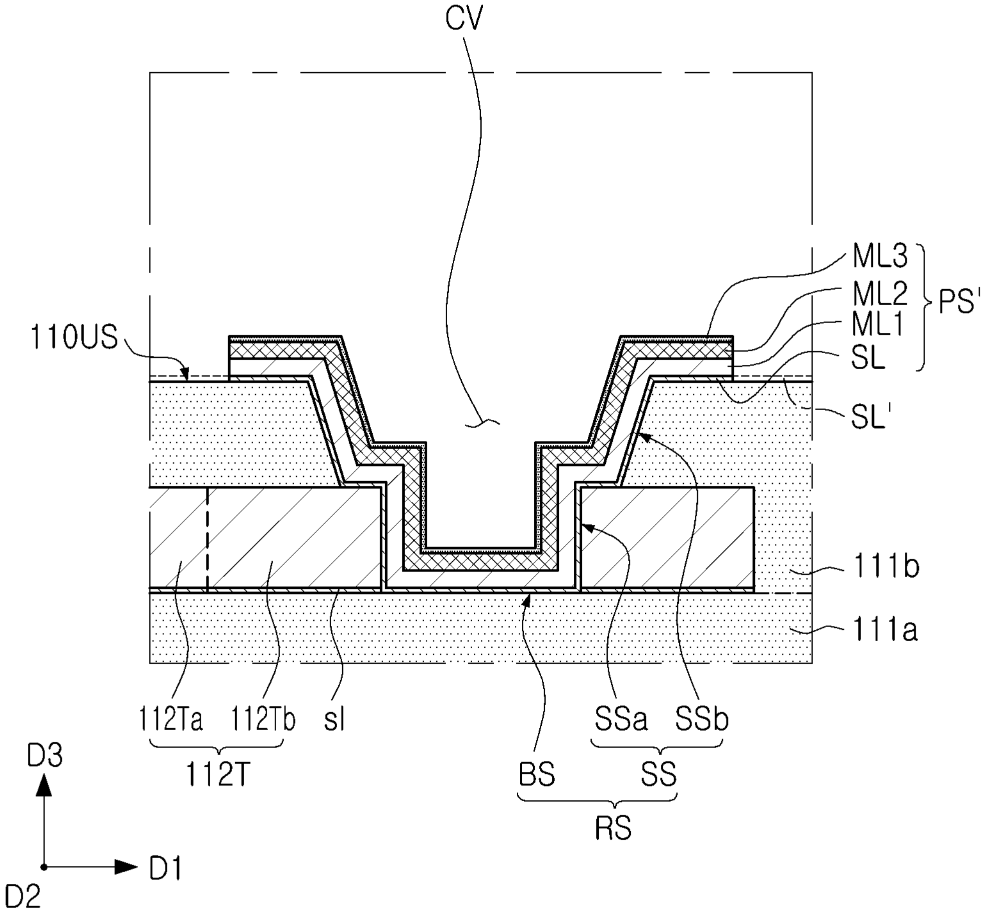

Referring to FIG. 9F, a preliminary pad structure PS' may be formed by etching the preliminary seed layer SL'. The preliminary pad structure PS' may include a first conductive layer SL, a first metal layer ML1, a second metal layer ML2, and a third metal layer ML3. Here, the first metal layer ML1 may correspond to the second conductive layer CL described above with reference to FIG. 2A, and the second metal layer ML2 may correspond to the third conductive layer BL described above with reference to FIG. 2A. A cavity CV that opens upwardly may be defined by the preliminary pad structure PS'. Thereafter, a semiconductor chip 120 may be mounted on the preliminary pad structure PS'.

Figure 9G:
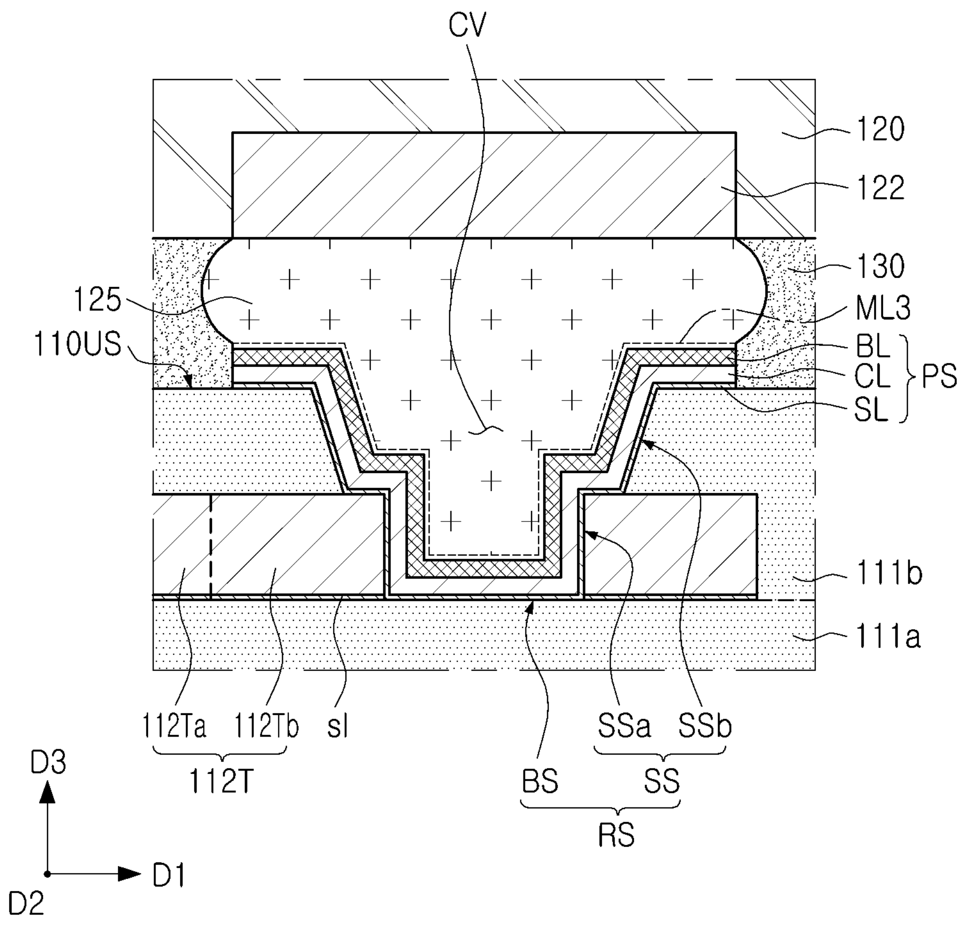

Referring to FIG. 9G, a connection bump 125 may be filled in the cavity CV by a reflow process. The connection bump 125 may electrically connect the connection terminal 122 of the semiconductor chip 120 and the pad structure PS. The pad structure PS may include a second conductive layer CL corresponding to the first metal layer ML1 and a third conductive layer BL corresponding to the second metal layer ML2. The third metal layer ML may be diffused in a reflow process, so that a boundary thereof between the pad structure PS and the connection bump 125 might not be distinguished. Subsequently, an encapsulant 130 or an underfill layer surrounding the connection bump 125 may be formed. Depending on the embodiment, an intermetallic compound layer may be formed between the connection bump 125 and the third conductive layer BL. As described above, since the connection bump 125 is filled in the cavity CV, reliability between the connection terminal 122 and the pad structure PS may be increased.

As set forth above, according to example embodiments of the present inventive concept, by introducing a pad structure having a cavity, a semiconductor package having increased reliability may be provided.

The various aspects of the present inventive concept are not necessarily limited to the above description, and may be more easily understood in the course of describing the specific embodiments of the present inventive concept. While example embodiments have been shown and described above, it will be apparent to those skilled in the art that modifications and variations could be made without departing from the scope of the present inventive concept.

While example embodiments have been shown and described above, it will be apparent to those skilled in the art that modifications and variations could be made without departing from the scope of the present inventive concept.

What is claimed is:

1. A semiconductor package, comprising:

a redistribution structure including:

an insulating layer defining an upper surface of the redistribution structure and a lower surface of the redistribution structure;

a plurality of redistribution layers disposed within the insulating layer;

a recess extending from the upper surface into the insulating layer and exposing at least a portion of a first uppermost redistribution layer among the plurality of redistribution layers; and a first pad structure disposed on a bottom of the recess and an inner wall of the recess, the first pad structure defining a cavity that is open upwardly;

a semiconductor chip disposed on the upper surface of the redistribution structure, and including a connection terminal electrically connected to the plurality of redistribution layers;

a connection bump disposed within the cavity, and electrically connecting the connection terminal of the semiconductor chip and the first pad structure of the redistribution structure to each other; and an encapsulant covering at least a portion of the semiconductor chip, wherein the inner wall of the recess includes a lower region defined by at least one side surface of the first uppermost redistribution layer, and wherein at least a portion of the connection bump is disposed within the lower region of the recess.

2. The semiconductor package of claim 1, wherein a height from the upper surface of the insulating layer to the bottom of the recess is greater than a height from the upper surface of the insulating layer to an upper surface of the first uppermost redistribution layer.

3. The semiconductor package of claim 1, wherein the inner wall of the recess has an upper region defined by the insulating layer on an upper surface of the first uppermost redistribution layer.

4. The semiconductor package of claim 3, wherein a maximum width of the upper region is greater than a maximum width of the lower region.

5. The semiconductor package of claim 3, wherein an inclination angle of the lower region with respect to the bottom of the recess is greater than an inclination angle of the upper region with respect to the bottom of the recess.

6. The semiconductor package of claim 1, wherein the recess comprises a first side defined by the first uppermost redistribution layer and the insulating layer on an upper surface of the first uppermost redistribution layer, and a second side defined only by the insulating layer.

7. The semiconductor package of claim 6, wherein the first side and the second side are asymmetrical with respect to each other about a center line of the first pad structure.

8. The semiconductor package of claim 1, wherein the connection bump fills a space between the connection terminal and the first pad structure, and an inside of the cavity.

9. The semiconductor package of claim 1, wherein the first pad structure comprises:

a first conductive layer extending along the upper surface of the insulating layer, the bottom of the recess, and the inner wall of the recess;

a second conductive layer disposed on the first conductive layer; and a third conductive layer disposed on the second conductive layer.

10. The semiconductor package of claim 9, wherein the first conductive layer comprises titanium (Ti), the second conductive layer comprises copper (Cu), and the third conductive layer comprises nickel (Ni).

11. The semiconductor package of claim 9, wherein an intermetallic compound layer is disposed at an interface between the third conductive layer and the connection bump.

12. The semiconductor package of claim 1, wherein the redistribution structure further comprises:

a second pad structure including a pad portion disposed on the upper surface; and a via portion extending into the insulating layer from the pad portion and connected to a second uppermost redistribution layer among the plurality of redistribution layers.

13. The semiconductor package of claim 12, wherein a height from the upper surface of the insulating layer to a lower surface of the second pad structure is smaller than a height from the upper surface of the insulating layer to a lower surface of the first pad structure.

14. The semiconductor package of claim 12, further comprising:

a through-via disposed on the second pad structure.

15. The semiconductor package of claim 1, wherein a distance between a lower surface of the semiconductor chip on which the connection terminal is disposed and the upper surface of the insulating layer is about 20 μm or less.

16. A semiconductor package, comprising:

a redistribution structure including:

an insulating layer defining an upper surface of the redistribution structure and a lower surface of the redistribution structure;

a plurality of redistribution layers disposed within the insulating layer; and a pad structure disposed within a recess and extending into the insulating layer from the upper surface and connected to at least a portion of an uppermost redistribution layer among the plurality of redistribution layers, the pad structure defining a cavity that is open upwardly;

a semiconductor chip disposed on the redistribution structure, and including a connection terminal electrically connected to the plurality of redistribution layers; and a connection bump disposed on the pad structure, and electrically connecting the connection terminal of the semiconductor chip and the pad structure to each other, wherein a lower surface of the connection bump is lower than an upper surface of the uppermost redistribution layer, wherein an inner wall of the recess includes a lower region defined by at least one side surface of the uppermost redistribution layer, and wherein at least a portion of the connection bump is disposed within the lower region of the recess.

17. The semiconductor package of claim 16, wherein the uppermost redistribution layer comprises a landing portion including a through-hole, and wherein the pad structure and the connection bump are disposed within the through-hole.

18. The semiconductor package of claim 16, wherein a height of the cavity is greater than a height from an upper surface of the pad structure to the connection terminal.

19. The semiconductor package of claim 16, wherein the connection bump comprises tin (Sn) or an alloy of tin (Sn).

20. A semiconductor package, comprising:

a redistribution structure including:

an insulating layer defining an upper surface of the redistribution structure and a lower surface of the redistribution structure;

a plurality of redistribution layers disposed within the insulating layer; and a pad structure extending into the insulating layer from the upper surface and connected to at least a portion of an uppermost redistribution layer among the plurality of redistribution layers, and defining a cavity that is open upwardly;

a semiconductor chip disposed on the redistribution structure, and including a connection terminal electrically connected to the plurality of redistribution layers; and a connection bump disposed on the pad structure, and electrically connecting the connection terminal of the semiconductor chip and the pad structure to each other, wherein the cavity includes a first sidewall adjacent to the at least a portion of the uppermost redistribution layer and a second sidewall opposite to the first sidewall, and wherein a first distance from the first sidewall to a center line of the pad structure is shorter than a second distance from the second sidewall to the center line of the pad structure.

* * * * *